United States Patent
Moriya et al.

(10) Patent No.: US 8,404,050 B2
(45) Date of Patent: Mar. 26, 2013

(54) PLASMA PROCESSING APPARATUS AND METHOD

(75) Inventors: Tsuyoshi Moriya, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/559,373

(22) Filed: Jul. 26, 2012

(65) Prior Publication Data
US 2012/0285623 A1 Nov. 15, 2012

Related U.S. Application Data

(60) Continuation of application No. 12/359,691, filed on Jan. 26, 2009, now Pat. No. 8,231,800, which is a division of application No. 11/091,416, filed on Mar. 29, 2005, now abandoned.

(30) Foreign Application Priority Data

Mar. 29, 2004 (JP) .................................. 2004-096455

(51) Int. Cl.
*C23C 16/00* (2006.01)
(52) U.S. Cl. ....................................... 118/728; 156/915
(58) Field of Classification Search .................. 118/726; 156/915
See application file for complete search history.

(56) References Cited

U.S. PATENT DOCUMENTS

| | | | |
|---|---|---|---|
| 6,013,159 | A | 1/2000 | Adams et al. |
| 6,333,246 | B1 | 12/2001 | Narita et al. |
| 2002/0019141 | A1 | 2/2002 | Ito et al. |

FOREIGN PATENT DOCUMENTS

| | | |
|---|---|---|
| EP | 1119030 | 7/2001 |
| JP | 10-284471 | 10/1998 |
| JP | 2000-091247 | 3/2000 |
| JP | 2002-033376 | 1/2002 |

*Primary Examiner* — Keath Chen
(74) *Attorney, Agent, or Firm* — Oblon, Spivak, McClelland, Maier & Neustadt, L.L.P.

(57) ABSTRACT

There is provided a plasma processing apparatus including a plasma generating unit for generating a plasma in a processing chamber in which a set processing is performed on a substrate serving as an object to be processed. The plasma processing apparatus further includes a particle moving unit for electrostatically driving particles in a region above the substrate to be removed out of the region above the substrate in the processing chamber while the processing on the substrate is performed by using the plasma. In addition, there is provided a plasma processing method of a plasma processing apparatus including the steps of generating plasma in a processing chamber in which a set processing is performed on a substrate serving as an object to be processed; and performing the processing on the substrate by the plasma.

19 Claims, 6 Drawing Sheets

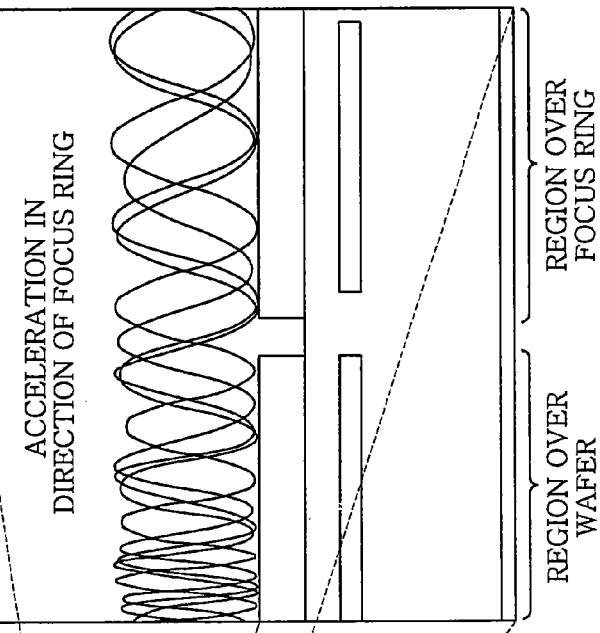
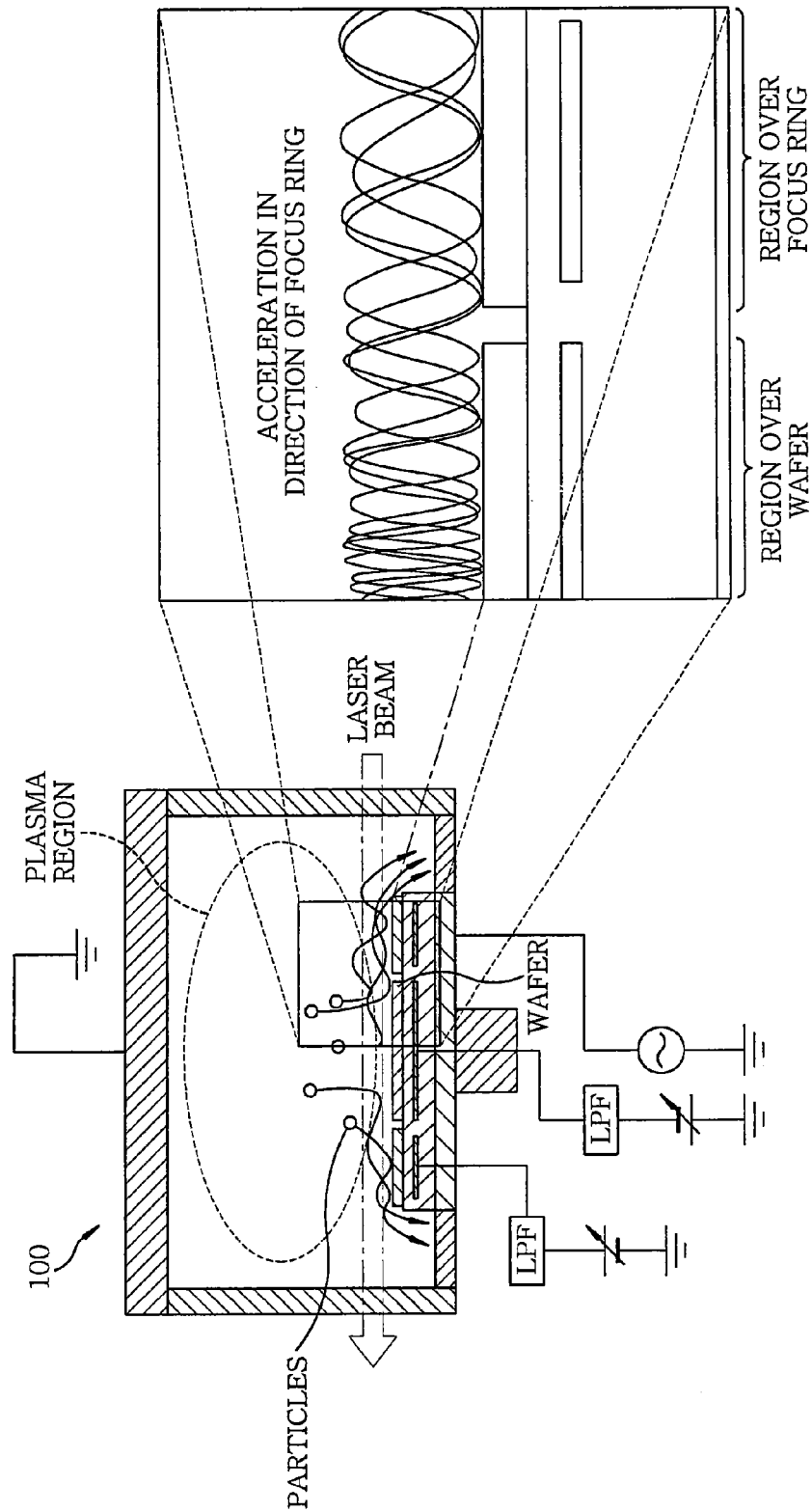

PLASMA PROCESSING APPARATUS AND METHOD

CROSS-REFERENCE TO RELATED APPLICATIONS

This application is a continuation of and claims the benefit of priority under 35 U.S.C. §120 from U.S. Ser. No. 12/359,691, filed Jan. 26, 2009 now U.S. Pat. No. 8,231,800, which is a divisional of U.S. application Ser. No. 11/091,416, filed Mar. 29, 2005, now abandoned, the entire contents of each of which are incorporated herein by reference. This application also claims priority under 35 U.S.C. §119 from Japanese Patent Application No. 2004-096455, filed respectively on Mar. 29, 2004.

FIELD OF THE INVENTION

The present invention relates to a plasma processing apparatus and method; and, more particularly, a plasma processing apparatus and method using a processing chamber for performing a plasma processing on a substrate.

BACKGROUND OF THE INVENTION

Recently, a treatment using a plasma (hereinafter, referred to as "plasma processing") such as an etching, sputtering and CVD (chemical vapor deposition) has been employed to be performed on an object to be processed such as a semiconductor wafer (hereinafter, referred to as "wafer") in a manufacturing process of a semiconductor apparatus.

An apparatus for carrying out such process (shown in FIG. 8) has a processing chamber 800, which is a cylindrical container, for performing a plasma processing on a wafer. The processing chamber 800 includes a chamber sidewall 810, an upper electrode 811 installed at the top of the chamber 800, a lower electrode 812 installed in a lower portion of the processing chamber 800, an ESC (electrostatic chuck) stage 820 and a focus ring 821 mounted on an upper side of the lower electrode 812, and a baffle plate 830 interposed between the chamber sidewall 810 and the lower electrode 812.

The upper electrode 811, which has a plurality of through holes not shown in the drawing, serves as a shower head for introducing a process gas for the plasma processing into the processing chamber 800 through the through holes. The lower electrode 812 is connected to a high frequency power supply 813. The focus ring 821 is made of a ring-shaped member formed to enclose a wafer mounted on the upper side of the ESC stage 820.

The ESC stage 820 includes an ESC electrode 820a embedded in the ESC stage 820 to electrostatically adsorb the mounted wafer onto the ESC stage 820. The ESC electrode 820a is connected to a variable power supply 822 for providing electric power required to adsorb the wafer onto the ESC electrode 820a.

In the plasma processing apparatus shown in FIG. 8 is formed a plasma region of the plasma generated by a high frequency electric field formed in a space between the upper electrode 811 and the lower electrode 812 as shown in the figure. The plasma processing apparatus performs an etching on, for example, an oxide film already formed on an upper side of the wafer by the generated plasma. The particles detached from an inner wall of the chamber sidewall 810 by the etching float around inside the processing chamber 800. After the etching is completed, the particles are removed by exhausting the processing chamber 800 through a small through hole (not shown) located in the baffle plate 830 by using a pump which is not shown.

Such particles are negatively charged by the electrons in the plasma to float around the plasma region above the wafer during the etching process, and will be attached onto the upper side of the wafer to thereby contaminate the wafer after the plasma production is stopped by completing the etching process.

There are disclosed techniques that can be employed to prevent the particles from being attached onto the upper side of the wafer as described above, wherein the charged particles are actively removed by using another electrode installed in the processing chamber 800 before the plasma generation or after the plasma extinction (for example, References 1 and 2).

(Reference 1) Japanese Patent Laid-open Application No. H10-284471

(Reference 2) European Patent Publication No. 1119030

However, although the particles can be driven from the region above the wafer towards the other electrode before the plasma being generated or after the plasma being extinguished by the techniques described in References 1 and 2, it is not practical to remove the particles while the plasma is being produced because the other electrode causes to generate an abnormal discharge or to produce particles during the plasma generation.

Further, since the particles in the region above the wafer effectively mask the parts to be processed on the wafer to thereby reduce the yield, it is required that these particles have to be purged out of the region above the wafer especially while the plasma is being generated. In addition, by suppressing the yield reduction, the productivity is expected to improve.

SUMMARY OF THE INVENTION

It is a first object of the present invention to provide a plasma processing apparatus and method for inhibiting the attachment of the particles to prevent the contamination of the wafer.

It is a second object of the present invention to provide a plasma processing apparatus and method for removing the particles from the region above the wafer during the plasma generation to enhance the productivity.

In accordance with one aspect of the present invention, there is provided a plasma processing apparatus comprising a plasma generating unit for generating a plasma in a processing chamber in which a set processing is performed on a substrate serving as an object to be processed, the plasma processing apparatus further comprising a particle moving unit for electrostatically driving particles in a region above the substrate to thereby be removed out of the region above the substrate in the processing chamber while the processing on the substrate is performed by using the plasma.

Preferably, the particle moving unit includes: a mounting table for mounting the substrate; a first electrode for electrostatically adsorbing the substrate onto the mounting table; a ring-shaped member installed to enclose a periphery of the substrate; a second electrode for electrostatically adsorbing the ring-shaped member onto the mounting table; a first power supply, connected to the first electrode, for supplying an electric power with a first electric potential; and a second power supply, connected to the second electrode, for supplying an electric power with a second electric potential different from the first electric potential, wherein the mounting table, the first electrode, the ring-shaped member, and the second electrode are installed in the processing chamber.

Preferably, the particle moving unit includes a voltage controller for controlling at least a potential of the second electrode to remove the particles from the region above the substrate to a region above the second electrode.

Preferably, the second electric potential is higher than the first electric potential when the particles are negatively charged during the plasma processing.

Preferably, the first electric potential is of negative polarity and the second electric potential is of positive or negative polarity.

Preferably, the second electric potential is higher than an electric potential formed near a surface of the substrate in the region above the substrate in response to the first electric potential or a self-bias potential formed by the generation of the plasma.

Preferably, the plasma processing apparatus further comprises a particle removing unit for removing the particles in the processing chamber.

Preferably, the plasma processing apparatus further comprises an exhausting unit for exhausting the processing chamber.

In accordance with another aspect of the present invention, there is provided a plasma processing method of a plasma processing apparatus, comprising the steps of generating a plasma in a processing chamber in which a set processing is performed on a substrate serving as an object to be processed; and performing the processing on the substrate by the plasma, the plasma processing method further comprising the step of electrostatically driving particles in a region above the substrate to thereby be removed out of the region above the substrate in the processing chamber during the processing on the substrate.

Preferably, the plasma processing apparatus includes a mounting table for mounting the substrate; a first electrode for electrostatically adsorbing the substrate onto the mounting table; a ring-shaped member installed to enclose a periphery of the substrate; a second electrode for electrostatically adsorbing the ring-shaped member onto the mounting table; a first power supply, connected to the first electrode, for supplying an electric power with a first electric potential; and a second power supply, connected to the second electrode, for supplying an electric power with a second electric potential different from the first electric potential, wherein the mounting table, the first electrode, the ring-shaped member, and the second electrode are installed in the processing chamber, and wherein the step of driving particles includes the substep of supplying the electric power with a second electric potential different from the first electric potential to the second electrode by the second power supply.

Preferably, the step of driving particles further includes the substep of controlling at least a potential of the second electrode to remove the particles from the region above the substrate to a region above the second electrode.

Preferably, the second electric potential is higher than the first electric potential when the particles are negatively charged during the plasma processing.

Preferably, the first electric potential is of negative polarity and the second electric potential is of positive polarity.

Preferably, the first electric potential is of negative polarity and the second electric potential is of negative polarity.

Preferably, the second electric potential is higher than an electric potential formed near a surface of the substrate in the region above the substrate in response to the first electric potential or a self-bias potential formed by the generation of the plasma.

Preferably, the plasma processing method further comprises the step of removing the particles in the processing chamber.

Preferably, the plasma processing method further comprises the step of exhausting the processing chamber.

In accordance with the present invention, since the particles in the region above the substrate are electrostatically driven out of the region above the substrate in the processing chamber during the processing on the substrate by the plasma, the attachment of the particles can be inhibited, thereby preventing the contamination of the wafer. Further, the particles are removed from the region above the substrate during the plasma generation, thereby enhancing the productivity.

Still further, the second power supply supplies the electric power with a second electric potential different from the first electric potential to the second electrode for electrostatically adsorbing the ring-shaped member installed at the periphery of the substrate onto the mounting table, thereby efficiently inhibiting the attachment of the particles.

Still further, at least a potential of the second electrode is controlled to remove the particles from the region above the substrate to a region above the second electrode, thereby efficiently inhibiting the attachment of the particles.

Still further, the second electric potential is higher than the first electric potential when the particles are negatively charged during the plasma processing, thereby efficiently inhibiting the attachment of the particles.

Still further, the first electric potential is of negative polarity and the second electric potential is of positive polarity, thereby efficiently inhibiting the attachment of the particles.

Still further, the second electric potential is higher than an electric potential formed near a surface of the substrate in the region above the substrate in response to the first electric potential or a self-bias potential formed by the generation of the plasma, thereby efficiently inhibiting the attachment of the particles.

Still further, the particles are removed in the processing chamber, thereby efficiently inhibiting the attachment of the particles.

Still further, the processing chamber is exhausted, thereby efficiently inhibiting the attachment of the particles.

BRIEF DESCRIPTION OF THE DRAWINGS

The above and other objects and features of the present invention will become apparent from the following description of preferred embodiments, given in conjunction with the accompanying drawings, in which:

FIG. 5A exemplarily depicts particle trajectories observed from an observation system shown in FIG. 7; and FIG. 5B is a partial enlarged view of FIG. 5A;

DETAILED DESCRIPTION OF THE PREFERRED EMBODIMENT

Hereinafter, a preferred embodiment of the present invention will be described with reference to the drawings.

Figure 1:
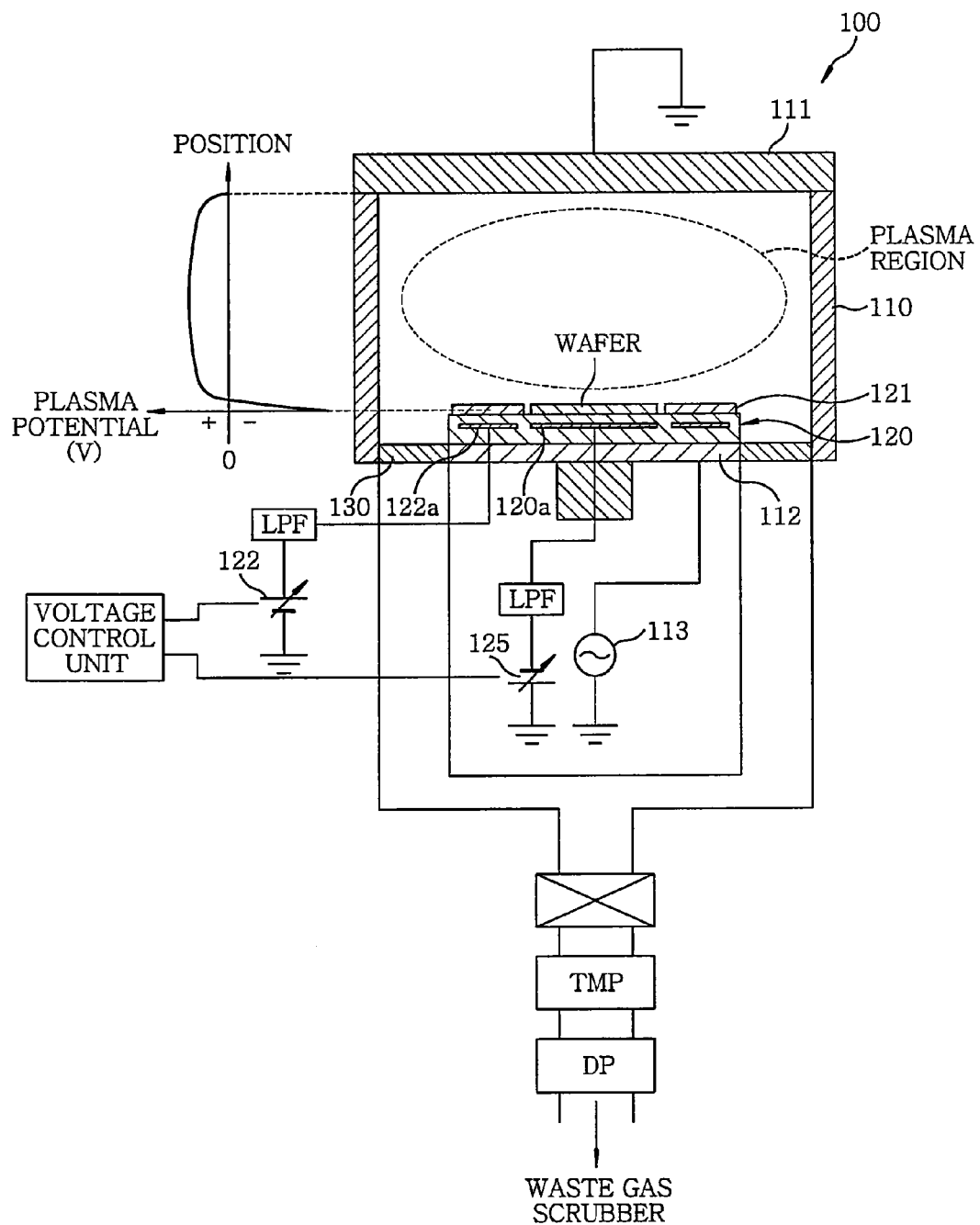
FIG. 1 shows a cross sectional view schematically illustrating a configuration of a plasma processing apparatus in accordance with a preferred embodiment of the present invention.

FIG. 1 shows a cross sectional view schematically illustrating a configuration of a plasma processing apparatus in accordance with a preferred embodiment of the present invention.

A plasma processing apparatus shown in FIG. 1 includes a processing chamber 100 which is a cylindrical container for a prearranged plasma-using processing (hereinafter, referred to as "plasma processing"), e.g., an etching, a sputtering or a CVD (chemical vapor deposition), to be performed on a semiconductor wafer (hereinafter, referred to as "wafer") functioning as an object to be processed; and is configured as, for example, a parallel-plate type CCP (capacitively coupled plasma) processing apparatus.

The processing chamber 100 includes a chamber sidewall 110, an upper electrode 111 installed at the top of the chamber, a lower electrode 112 installed in a lower portion of the processing chamber 100, an ESC (electrostatic chuck) stage 120 (mounting table) mounted on an upper side of the lower electrode 112, and an annular shaped baffle plate 130 interposed between the chamber sidewall 110 and the lower electrode 112.

In addition, to the outside of the processing chamber 100 is connected a gas exhaust line made of a tube-shaped member, and pumps such as a turbo molecular pump TMP and a dry pump DP are installed in the gas exhaust line. The pumps evacuate the processing chamber 100 via the baffle plate 130, exhausting gas containing particles by using a waste gas scrubber. Further, these pumps can be installed in the chamber sidewall 110 not via the baffle plate 130 but via a valve that can be freely opened and closed.

The upper electrode 111, which has a plurality of through holes not shown in the drawing, serves as a shower head for introducing a process gas for the plasma processing into the processing chamber 100 through the through holes. The lower electrode 112 is connected to a high frequency power supply 113 for providing a high frequency (RF: radio frequency) power.

The ESC stage 120 includes a focus ring (FR) 121 mounted on an upper side thereof; a wafer-adsorbing ESC electrode 120a (first electrode) embedded in the ESC stage 120 for electrostatically adsorbing the mounted wafer onto the ESC stage 120; and an FR-adsorbing ESC electrode 122a (second electrode) embedded in the ESC stage 120 for electrostatically adsorbing the focus ring 121 onto the ESC stage 120. The focus ring 121 is made of a ring-shaped member formed to enclose the wafer mounted on the upper side of the ESC stage 120.

The FR-adsorbing ESC electrode 122a is connected via an LPF (low pass filter) to an FR-adsorbing variable power supply 122 (second power supply) for providing a power required to adsorb the focus ring 121 onto the FR-adsorbing ESC electrode 122a. The wafer-adsorbing ESC electrode 120a is connected via an LPF (low pass filter) to a variable power supply 125 (first power supply) for providing a power required to adsorb the wafer onto the FR-adsorbing ESC electrode 122a. These LPFs are necessary because the ESC electrodes 120a and 122a are provided with an RF power generated by a capacitive coupling between the RF power supplied to the lower electrode 112 and the RF power supplied to the ESC electrode 120a and 122a through an insulted region in the ESC stage 120. The variable power supplies 122 and 125 are connected to a voltage control unit, which will be described later.

The plasma processing apparatus performs a plasma processing such as an etching on an oxide film already formed on an upper side of the wafer by using, for example, a plasma generated under an intermediate vacuum level. To generate the plasma, a high frequency (RF) electric field is generated in a space between the upper electrode 111 and the lower electrode 112 by providing an RF power to the lower electrode 112. (A plasma generating unit.) The plasma thus generated forms a plasma region in the processing chamber 100 as shown in FIG. 1.

The particles detached from places such as an inner wall on the chamber sidewall and the like float around in the processing chamber 100, especially in the plasma region thereof. The particles, floating in the plasma region, attract electrons contained in the plasma to thereby become negatively charged.

As shown in FIG. 1, a bulk plasma region, which is a central portion of the plasma region, has a positive polarity relative to a reference voltage 0 V of the upper electrode 111 and a substantially constant high electric potential (voltage). On the contrary, an ion sheath region (Ion Sheath, Dark Space), which is formed near the wafer surface in a region above the wafer, forms a large potential gradient due to the influence of an electrostatic force of the lower electrode 112 and the electric potential of the bulk plasma region. Thus, the electric potential of the ion sheath region is lower than the bulk plasma region, and the polarity thereof is negative. Further, a potential gradient is formed in a plasma periphery region, i.e., the plasma region excluding the bulk plasma region.

Therefore, the particles negatively charged by attracting the electrons in the plasma tend to float around in an upper part of the ion sheath region (the region above the wafer) within the plasma periphery region, because of a balance between the gravity pulling down the particles vertically and the upwardly repelling force generated by a potential gradient formed over a range from the negatively polarized ion sheath region to the positively polarized plasma periphery region, i.e., a potential difference between the surface of the lower electrode 112 and the bulk plasma region as well as an attractive force toward the positively polarized bulk plasma region.

Figure 2:
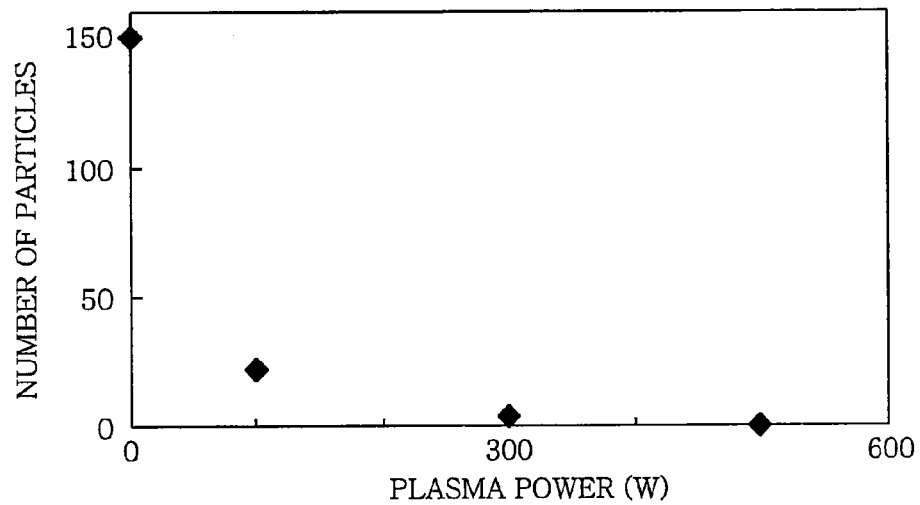
FIG. 2 provides a graph representing a relation between an electric power for generating a plasma and the number of particles.

FIG. 2 provides a graph representing a relation between a plasma power for generating plasma and the number of particles.

In FIG. 2, "plasma power" of the horizontal axis represents power consumption [W] calculated from the voltage and current applied to the high frequency power supply 113 for generating the plasma; and "number of particles" of the vertical axis represents the number of the particles observed in the processing chamber 100 when different voltages are applied to the high frequency power supply 113, i.e., the number of the particles detached from the chamber sidewall 110.

As shown in FIG. 2, the number of the particles decreases as the plasma power increases. This is because the electrostatic force of the generated plasma gets stronger as the plasma power gets higher so that the particles are efficiently exhausted from the region above the wafer. Therefore, it is preferable that the voltage applied to the high frequency power supply 113 for generating the plasma is high and the plasma power ranges from 100 W to 4000 W.

Figure 3:
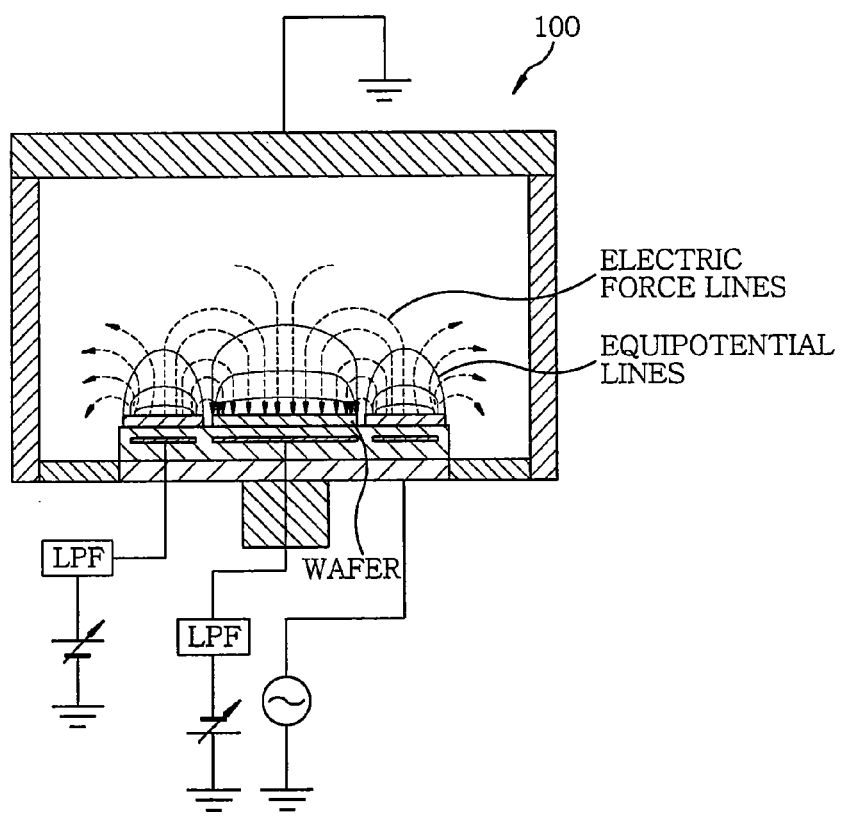
FIG. 3 describes an electric potential distribution formed in the processing chamber 100 shown in FIG. 1.

FIG. 3 describes an electric potential distribution formed in the processing chamber 100 shown in FIG. 1.

As shown in FIG. 3, in the plasma processing apparatus, an electric potential distribution represented by the electric force lines, i.e., dotted lines and the equipotential lines, i.e., solid lines is formed in the processing chamber 100 when electric powers of different voltages are applied to the ESC electrodes 120a and 122a, respectively. Further, the electric force lines represent the case where the electric potential of the power applied to the wafer-adsorbing ESC electrode 120a (first potential) is lower than that applied to the focus ring 121 (second potential).

Further, the turn-on and turn-off of the power is controlled by the voltage control unit (sequential control unit) shown in FIG. 1 as follows.

In case of turning on the power, the voltage control unit turns on the power to the wafer-adsorbing ESC electrode 120a after the RF power for generating the plasma is turned on, e.g., after 1 second therefrom; and then, turns on the power to the FR-adsorbing ESC electrode 122a after a predetermined time within a range of, for example, 0 to 100 msec. (The voltage control unit.) Further, in case of turning off the power, the voltage control unit turns off the power to the FR-adsorbing ESC electrode 122a; subsequently turns off the power to the wafer-adsorbing ESC electrode 120a after a predetermined time within a range of, for example, 0 to 100 msec; and then, turns off the RF power after, e.g., 1 second therefrom. Thus, the potential distribution shown in FIG. 3 can be formed in the processing chamber 100 while the atmosphere in the processing chamber 100 is electrostatically stable, but not while the atmosphere in the processing chamber 100 is electrostatically unstable, namely, right after the plasma is generated or the plasma is extinguished.

The voltage control unit has been described to control the turn-on and turn-off of the power application to the wafer-adsorbing ESC electrode 120a. However, the voltage control unit may well be able to control the voltage of the power to be applied to the FR-adsorbing ESC electrode 122a while it monitors the power application to the wafer-adsorbing ESC electrode 120a.

As shown in the equipotential lines described above, during the plasma processing, the focus ring 121 and the wafer is electrostatically adsorbed respectively onto high-voltage parts and low-voltage parts of the ESC stage 120. Further, the particles negatively charged by attracting the electrons contained in the plasma are also attracted under the influence of the electrostatic force towards high-voltage regions.

Figure 4:
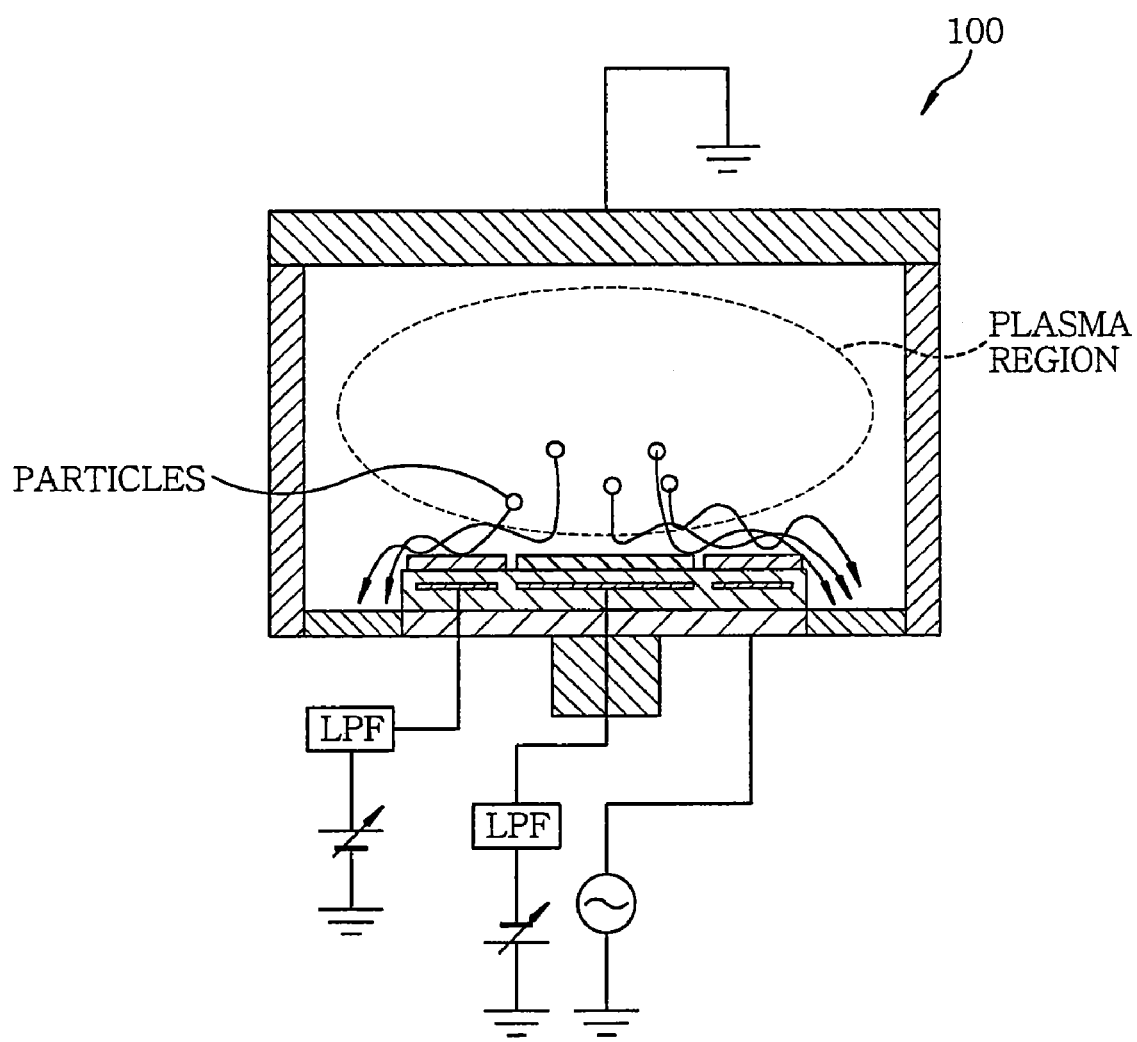
FIG. 4 exemplarily illustrates particle trajectories in a plasma region under a potential distribution represented by equipotential lines in FIG. 3.
Figure 7:
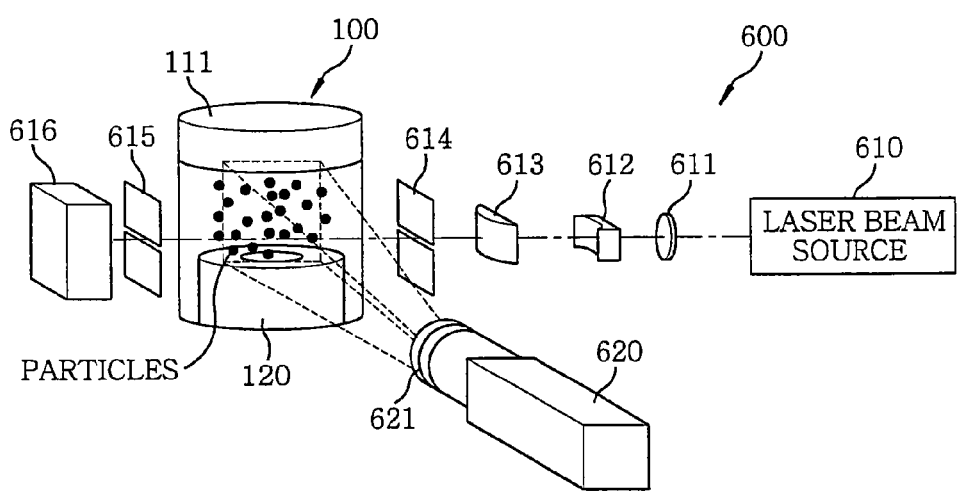
FIG. 7 schematically shows a configuration of the observation system for observing the particles to obtain the experimental results described in FIGS. 5A, 5B and 6.
Figure 8:
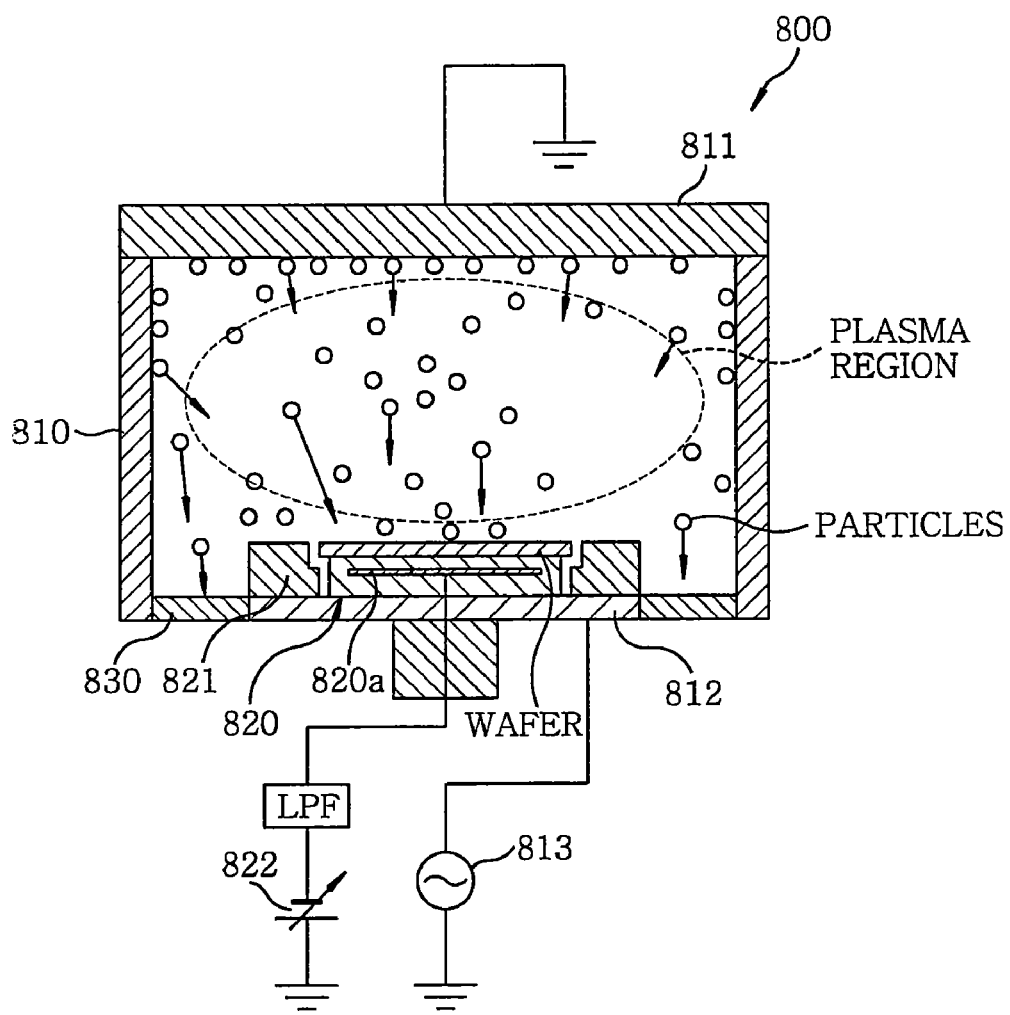
FIG. 8 schematically illustrates a configuration of the conventional plasma processing apparatus.

FIG. 4 exemplarily illustrates particle trajectories in a plasma region in case of such potential distribution represented by equipotential lines shown in FIG. 3. Further, FIG. 5A exemplarily depicts particle trajectories observed from an observation system that will be described in FIG. 7, and FIG. 5B is a partial enlarged view thereof.

As depicted by the particle trajectories in the plasma region (the region above the wafer) in FIGS. 4, 5A and 5B, when the potential distribution represented by the equipotential lines as shown in FIG. 3 is formed, the particles floating in the plasma region are driven out of the region above the wafer to somewhere above the focus ring 121 under the influence of the electrostatic force to be attracted towards the high-voltage region. (A particle moving unit.) To remove the particles efficiently, the potential of the FR-adsorbing ESC electrode 122a is preferably higher than the potential of the wafer-adsorbing ESC electrode 120a; and more preferably, higher than the potential formed in response thereto near the upper side of the wafer or the self-bias potential formed by the plasma generation.

Further, as shown in FIGS. 5A and 5B, the particle trajectories near the wafer are closely spaced in the horizontal direction, and those above the focus ring 121 are spread widely in the horizontal direction. This shows that the particles are accelerated from a place above the wafer to another place above the focus ring. This is because the particles get accelerated by being repelled by the potential difference between the self-bias potential of the ion sheath region and the potential of the plasma periphery region, i.e., the region between the surface of the lower electrode 112 and the bulk plasma region and, at the same time, attracted by a high potential of the FR-adsorbing ESC electrode 122a.

Furthermore, preferably, the potential of the FR-adsorbing ESC electrode 122a is of polarity opposite to that of the self-bias potential in case of setting the ground as a reference voltage 0 V or the potential formed near the upper side of the wafer in response to the potential of the wafer-adsorbing ESC electrode 120a in case of setting the ground as a reference voltage 0 V; in other words, of positive polarity. Thus, the potential of the FR-adsorbing ESC electrode 122a can easily be made higher than the self-bias potential or the potential formed near the upper side of the wafer in response to the potential of the wafer-adsorbing ESC electrode 120a, thereby a force attracting the particles onto somewhere above the focus ring 121 can be ensured to be generated.

Figure 6:
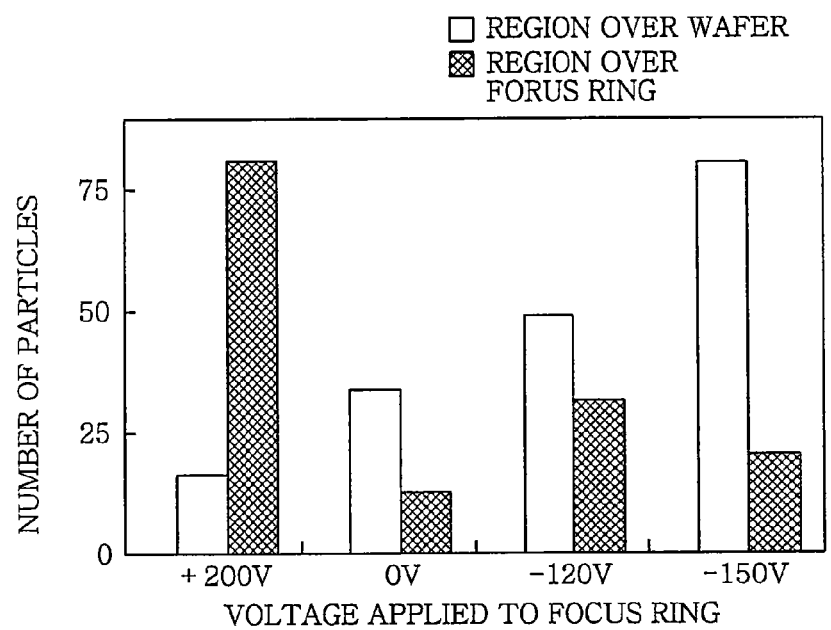
FIG. 6 presents a graph showing a relation between the number of the particles observed as in FIGS. 5A and 5B and a voltage applied to an ESC electrode 122a for FR adsorption.

FIG. 6 presents a graph showing a relation between the number of the particles observed as in FIGS. 5A and 5B and a voltage applied to an ESC electrode 122a for FR adsorption. Further, FIG. 6 exemplifies a measurement result of the number of the particles observed by the observation system 600 shown in FIG. 7, which will be described later.

In FIG. 6, "voltage applied to focus ring" of the horizontal axis represents the voltage applied to the FR-adsorbing ESC electrode 122a in case where the voltage applied to the wafer-adsorbing ESC electrode 120a (hereinafter, referred to as "voltage applied to the wafer") is constant at 0 V that is the reference voltage of the ground. Therefore, the voltage applied to the focus ring also represents a relative potential difference with respect to the voltage applied to the wafer (hereinafter, referred to as "relative potential difference").

As shown in FIG. 6, if the voltage applied to the focus ring is higher than the voltage applied to the wafer (for example, the voltage applied to the focus ring is +200 V, i.e., the relative potential difference is +200 V), the number of the particles over the wafer is small but the number of the particles over the focus ring 121 is large. On the contrary, if the voltage applied to the focus ring is not higher than the voltage applied to the wafer (for example, the voltage applied to the focus ring is 0 V, −120V, or −150 V, i.e., the relative potential difference is 0 V, −120V, or −150 V), the number of the particles over the wafer is large but the number of the particles over the focus ring 121 is small.

Further, as shown in FIG. 6, the number of the particles over the wafer decreases and that over the focus ring 121 increases as the relative potential difference increases. Preferably, if the relative potential difference is +150 V or higher, the number of the particles over the wafer can certainly be made smaller than that over the focus ring 121.

Referring to FIGS. 3 to 6, by setting the potential of the power supplied to the wafer-adsorbing ESC electrode 120a lower than the potential of the power supplied to the FR-adsorbing ESC electrode 122a, the number of the particles in the region above the wafer during the plasma processing, especially the number of the particles in the plasma periphery region and the ion sheath region, i.e., the particles in somewhere between the bulk plasma region and the wafer surface, is reduced, thereby the attachment of the particles can be suppressed to thereby prevent the wafer contamination.

Further, since the particles in the region above the wafer during the plasma processing are driven out of the region above the wafer, the effect described hereinafter can be achieved.

By reducing the particles effectively masking the portion to be processed on the wafer, the plasma processing can be carried out without being obstructed by the particles, thereby the yield can be increased and thus the productivity can be enhanced.

Since the number of particles over the wafer can be reduced during the plasma processing, a cleaning operation of the processing chamber performed before the plasma processing can be facilitated; and, more specifically, the cleaning cycle can be extended, the seasoning time after a wet cleaning can be shortened, and, further, the start-up time of the plasma processing apparatus can be shortened. As a result, the operation time of the plasma processing apparatus can be increased, thereby significantly enhancing the productivity.

FIG. 7 schematically shows a configuration of the observation system for observing the particles to obtain the experimental results described in FIGS. 5A, 5B and 6.

In FIG. 7, the observation system 600 includes a laser light source 610, which is of SHG-YAG laser, for applying a laser beam with a wavelength of 532 nm onto the particles in the processing chamber 100, and an image-enhancement type CCD camera 620 for imaging the inside of the processing chamber 100. Furthermore, in the observation system 600, a half-wave plate 611, lenses 612 and 613, slits 614 and 615, and a light extinction device 616 are arranged in this order along the light path from the laser light source 610 to apply laser light scattering method. Between the slits 614 and 615 is inserted the processing chamber 100 (see FIG. 4). A beam of light, scattered by the particles in the processing chamber 100, enters the CCD camera 620 via an interference filter 621 used for the light with a wavelength of 532 nm.

In the plasma processing apparatus shown in FIG. 1, if the plasma is extinguished by stopping the power application to the ESC electrodes 120a and 122a after completing the plasma processing, the particles in the processing chamber 100 are removed because the plasma chamber 100 is exhausted via the baffle plate 130 by the exhaust pumps. (A particle removing unit, an exhausting unit.) Further, the exhausting process can be carried out during the plasma processing.

Since the exhaust pumps evacuate via the baffle plate 130 in the lower portion of the processing chamber 100, the exhausting efficiency is generally low in the region near the wafer surface. However, as described with reference to FIGS. 3 to 6, the particle removing efficiency of the exhaust pumps can be enhanced because the particles are moved to a region where the exhausting efficiency of the pump is high, i.e., towards a region above the focus ring 121 near the baffle plate 130, during the plasma processing. Therefore, we can make it sure that the particles are prevented from being attached onto the upper surface of the wafer after the plasma extinction.

In the plasma processing apparatus in accordance with the preferred embodiment, the plasma to be generated was exemplified as a CCP generated by an RF power. However, other kinds of plasma such as an ICP (inductive coupled plasma) generated by an RF power or a UHF (ultrahigh frequency plasma) generated by a microwave can also be used therein.

The plasma processing apparatus in accordance with the preferred embodiment of the present invention can be applied to plasma-used processes such as an etching process, a sputtering process, and a CVD process.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing apparatus, comprising:
a processing chamber for processing a substrate serving as an object to be processed;
a mounting table for mounting the substrate;
a first electrode for electrostatically adsorbing the substrate onto the mounting table;
a ring-shaped member installed around a periphery of the substrate;
a second electrode for electrostatically adsorbing the ring-shaped member onto the mounting table;
a first power supply for supplying the first electrode with a first electric power having a first electric potential;
a second power supply for supplying the second electrode with a second electric power having a second electric potential different from the first electric potential; and
a control unit configured to control the following steps of:
generating a plasma in the processing chamber in which a plasma processing is performed on the substrate;
performing the processing on the substrate by the plasma; and
electrostatically driving particles in a region above the substrate to remove the particles out of the region above the substrate during the plasma processing on the substrate,
wherein the mounting table, the first electrode, the ring-shaped member, and the second electrode are installed in the processing chamber,
wherein said driving the particles includes supplying the second electric power to the second electrode by the second power supply, and
wherein the control unit is configured to control the second electric power to be turned on while the plasma is generated and to be turned off before stopping said generating the plasma.

2. The plasma processing apparatus of claim 1, wherein said driving the particles further includes controlling at least the second electric potential to remove the particles from the region above the substrate to a region above the second electrode.

3. The plasma processing apparatus of claim 1, wherein the second electric potential is higher than the first electric potential when the particles are negatively charged during the plasma processing.

4. The plasma processing apparatus of claim 1, wherein the first electric potential is of a negative polarity and the second electric potential is of a positive polarity.

5. The plasma processing apparatus of claim 1, wherein the first electric potential is of a negative polarity and the second electric potential is of a negative polarity.

6. The plasma processing apparatus of claim 1, wherein the second electric potential is higher than an electric potential formed near a surface of the substrate in the region above the substrate in response to the first electric potential or a self-bias potential formed by the generation of the plasma.

7. The plasma processing apparatus of claim 1, further comprising a particle removing unit for removing the particles from the processing chamber.

8. The plasma processing apparatus of claim 7, further comprising an exhausting unit for exhausting the processing chamber.

9. The plasma processing apparatus of claim 1, wherein the control unit is configured to control the second electric power to be turned on after starting said generating the plasma.

10. The plasma processing apparatus of claim 9, wherein the control unit is configured to control the first electric power to be turned off not before the second electric power is turned off but before stopping said generating the plasma.

11. The plasma processing apparatus of claim 10, wherein the control unit is configured to control the first electric power to be turned on after starting said generating the plasma but not after the second electric power is turned on.

12. The plasma processing apparatus of claim 11, wherein the control unit is configured to control the first electric power to be turned on 1 second after starting said generating the plasma.

13. The plasma processing apparatus of claim 12, wherein the control unit is configured to control the first electric power to be turned off 1 second before stopping said generating the plasma.

14. The plasma processing apparatus of claim 12, wherein the control unit is configured to control the second electric power to be turned off 0 to 100 milliseconds before the first electric power is turned off.

15. The plasma processing apparatus of claim 11, wherein the control unit is configured to control the second electric power to be turned on 0 to 100 milliseconds after the first electric power is turned on.

16. A plasma processing apparatus, comprising:
a chamber for processing an object to be processed;
a high frequency power supply for generating a plasma in the chamber;
a lower electrode installed in a lower portion of the chamber;
a mounting table installed on the lower electrode for electrostatically mounting the object;
an exhausting unit for exhausting the chamber;
a first electrode embedded in the mounting table;
a first power supply, connected to the first electrode, for supplying a first electric power with a first electric potential to the first electrode;
a ring-shaped member installed on the mounting table to enclose a periphery of the object;
a second electrode embedded in the mounting table for electrostatically adsorbing the ring-shaped member onto the mounting table;
a second power supply, connected to the second electrode, for supplying a second electric power with a second electric potential different from the first electric potential to the second electrode; and
a control unit configured to control the following steps of:
turning on a high frequency power from the high frequency power supply to generate the plasma in the chamber in a first process;
turning on the first electric power from the first power supply to the first electrode in a second process after the first process;
turning on the second electric power from the second power supply to the second electrode in a third process after the second process;
processing the object by the plasma in a fourth process;
turning off the second electric power from the second power supply to the second electrode in a fifth process after the fourth process;
turning off the first electric power from the first power supply to the first electrode in a sixth process after the fifth process; and
turning off the high frequency power from the high frequency power supply in a seventh process after the sixth process.

17. A plasma processing apparatus, comprising:
a chamber for processing an object to be processed;
a high frequency power supply for generating a plasma in the chamber;
a lower electrode installed in a lower portion of the chamber;
a mounting table installed on the lower electrode for electrostatically mounting the object;
an exhausting unit for exhausting the chamber:
a first electrode embedded in the mounting table:
a first power supply, connected to the first electrode, for supplying a first electric power with a first electric potential to the first electrode;
a ring-shaped member installed on the mounting table to enclose a periphery of the object;
a second electrode embedded in the mounting table for electrostatically adsorbing the ring-shaped member onto the mounting table;
a second power supply, connected to the second electrode, for supplying a second electric power with a second electric potential different from the first electric potential to the second electrode; and
a control unit configured to control the following steps of:
generating the plasma in the chamber by a high frequency power from the high frequency power supply in a first process;
processing the object by the plasma in a second process;
turning off the second electric power from the second power supply to the second electrode in a third process after the second process;
turning off the first electric power from the first power supply to the first electrode in a fourth process after the third process; and
turning off the high frequency power from the high frequency power supply in a fifth process after the fourth process.

18. The plasma processing apparatus of claim 17, wherein the control unit is configured to control the second electric potential of the second electric power to be higher than the first electric potential of the first electric power.

19. The plasma processing apparatus of claim 18, wherein the control unit is configured to control the second electric potential of the second electric power to be higher than the first electric potential of the first electric power.

* * * * *